July 12, 1966 H. SEITER 3,260,633

METHOD OF REDUCING SEMICONDUCTOR JUNCTION AREAS

Filed Dec. 19, 1962

United States Patent Office 3,260,633

Patented July 12, 1966

3,260,633

METHOD OF REDUCING SEMICONDUCTOR JUNCTION AREAS

Hartmut Seiter, Munich, Germany, assignor to Siemens & Halske Aktiengesellschaft, Berlin, Germany, a corporation of Germany Filed Dec. 19, 1962, Ser. No. 245,895
Claims priority, application Germany, Dec. 21, 1961, S 77,220
4 Claims. (Cl. 156—17)

My invention relates to the production of semiconductor members in which a crystalline semiconductor body is alloyed together with an electrode of metal and comprises near the electrode a junction between different conductance regions, such as respective regions of different specific electric conductance or different conductance types. In a more particular aspect, my invention resides in a method for reducing the area of such junctions.

Electronic semiconductor devices that are to operate at high frequencies require very small junction areas between regions or different conductance and/or different types of conductance. The usual methods of producing such junctions, particularly the alloying process, make it difficult or infeasible to employ junction-forming parts below a given size. Many semiconductor devices, therefore, require that previously produced junctions be subsequently reduced in size by suitable elimination of material. This is the case, for example, with tunnel diodes produced by the alloying method. A smallest feasible area of the tunnel junction is necessary if such diodes are to be employed at high frequencies. However, the metal pellet employed as a junction-forming electrode must have a relatively large size for the alloying process because upon completion of that process a terminal contact must still be fastened to the pellet.

It is an object of my invention, therefore, to afford a subsequent reduction of a previously produced junction area by etching in a manner that reliably permits controlling the result so as to obtain an accurately predetermined size of the junction at the location where such reduction is needed but without appreciably reducing the size of the remaining electrode body or pellet.

Another object of the invention is to employ such controlled etching not only for reducing the size of the junction area but also for imparting to the junction the desired ultimate geometrical shape, and to secure uniform values of the electrical junction properties despite any departures from the desired value as may have resulted from the preceding manufacturing operations. More specifically, it is an object of my invention relating to tunnel diodes to afford regulating the current at the maximum of the current voltage characteristic by controlled undercutting of the alloy pellets with the aid of an etching process.

To achieve these objects, and in accordance with my invention, a previously produced semiconductor member, comprising a crystalline semiconductor body with an alloy-bonded electrode or pellet of metal, is subjected to an etching agent which contains substance reactive with the metal of the alloy pellet to form therewith a chemical compound insoluble in the etching agent and adherent to the pellet metal, so that substantially only the semiconductor body is attacked by the etching agent. As a result the pellet assumes a protective coating, and the semiconductor surface near metal pellet, and hence at the location of the junction, becomes undercut. As a rule, this etching operation is performed at elevated temperature, preferably at about 70° C. or more. Under such conditions, the metal of the pellet is soon coated with the passivating coating of compound not appreciably soluble in the etching agent. Particularly suitable as such passivating compounds are metal oxides, phosphates and similar compounds.

According to a preferred feature of my invention, the above-described process is particularly well applicable to semiconductor members having a crystalline body of gallium arsenide and an alloy bonded pellet of tin. The invention, therefore, will be hereinafter described preferentially with respect to such Ga-Sn members and with reference to the accompanying drawing in which.

Figure 1:
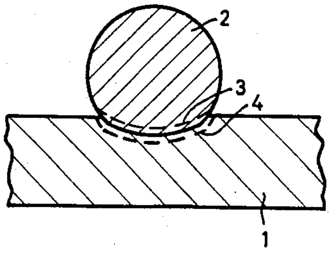
FIG. 1 shows schematically in section a tunnel diode with a p-n junction prior to etching.
Figure 3:
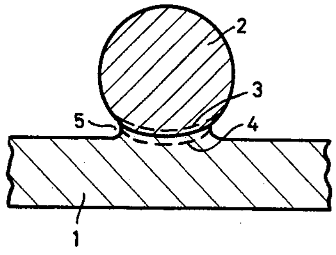
FIG. 3 shows the same tunnel diode as FIG. 1 after completion of the etching operation.

The geometric relations of the tunnel-diode components are represented in FIGS. 1 and 3 on greatly enlarged scale. The diode comprises a gallium arsenide plate 1 on which an alloying pellet of tin is seated. The pellet is firmly bonded to the crystalline plate 1 by alloying. After completion of the alloying operation, the pellet constitutes a small, approximately semispherical button on top of the crystal plate. Due to the alloying operation, tin atoms have migrated into the adjacent region of the gallium arsenide plate. As a result, a recrystallization zone 3 has come about. This zone and the p-n junction 4 between the recrystallization zone and the bulk of the semiconductor plate are both located within the crystalline body of the plate.

Etching methods are suitable for cleaning the external edges of the p-n junction and also for reducing the area size of the junction itself. The usual etching agents for gallium arsenide (for example aqua regia or $$H_2SO_4+H_2O_2$$

and similar acidic mixtures) also attack the tin pellet to a great extent so that the components of the member are rapidly damaged or even destroyed by the etching operation.

One of the more specific objects of my invention, therefore, is to employ an etching agent which greatly attacks the semiconductor material, in the present example the gallium arsenide, but which does not appreciably impair the tin electrode.

One way of passivating the tin for the purposes of the invention is to add to an etching agent, otherwise known as suitable for etching gallium arsenide or other semiconductor substance, a relatively large quantity of phosphoric acid. For example, an etching solution, suitable for polishing of gallium arsenide as well as for subsequent etching of gallium arsenide bodies with tin electrodes, is composed as follows:

10 parts $HNO_3$ (65%)
1 part HCl (25%)
90 parts $H_3PO_4$ (85%)

By comparison, the following etching agent has a reduced rate of attack so that the speed at which the material is etched away is reduced, but polishing effect on the gallium arsenide surface is also somewhat lower:

5 parts $HNO_3$ (65%)
1 part HCl (25%)
95 parts $H_3PO_4$ (85%)

It is in most cases preferable to perform the method at a temperature of at least 70° C., but it is usually not necessary to exceed a temperature of 100° C. Operating at such elevated temperatures has the advantage that the evolving gas bubbles become more easily separated from the etched surfaces without occurrence of an excessive etching as may aggrevate or prevent accurately controlling the desired shaping action.

Figure 2:
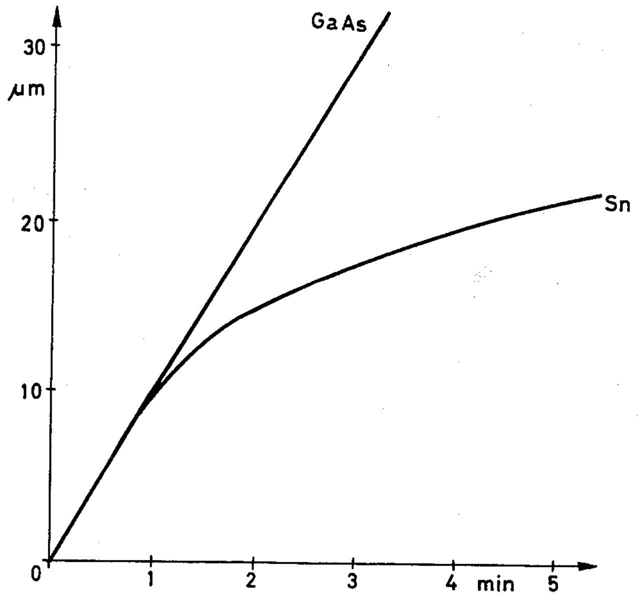
FIG. 2 is an explanatory graph.

FIG. 2 exemplifies the reduction in layer thickness of gallium arsenide and tin in the last-mentioned etching solution, as a function of time. The abscissa indicates etching duration in minutes, the ordinate indicates in micrometers, determined by weighing, the reduction in thickness of planar layers of gallium arsenide (GaAs) and tin (Sn). The etching temperature used was 80° C. The graph shows that the elimination of material at the beginning of the etching process was approximately the same for gallium arsenide and for tin, but that this rate rapidly declined for tin. There resulted on the tin a whitish layer of a tin phosphate not appreciably soluble in the solution. The excess of phosphoric acid inhibits the dissolving action of hydrochloric acid and nitric acid with respect to the tin phosphate; if the concentration of hydrochloric acid in the etching solution is more than 5%, a visible coating no longer forms on the tin, and the tin is noticeably attacked by the etching agent and dissolves therein.

With a suitably composed etching agent, therefore, the etching action predominantly takes place at the gallium arsenide. By "under-etching" the alloy pellet of tin, that is by virtue of the fact that the progressing etching effect causes the Ga-Sn member to assume an undercut shape beneath the tin pellet, the flow of current through the p-n junction can be reduced in a defined and controllable manner. Thus, the recrystallization zone beneath the alloy pellet and the region adjacent thereto can be reduced to very small diameters. A particular advantage of the invention is the fact that by virtue of this etching process the dimensions of the junctions can be adjusted in a reproducible manner so that uniform electrical property values are obtained with given starting materials.

FIG. 3, showing the gallium arsenide plate 1 with the alloy pellet 2 after the etching operation, is illustrative of the fact that the reduction in size of the alloy pellet 2 is negligible but that the transition region between gallium arsenide and alloy pellet has assumed the shape of a constriction 5. The mechanical strength at this constriction is still sufficient, for example for the purpose of subsequently attaching a contact wire or terminal to the metal pellet, because the crystal structure of the remaining material remained unchanged by the etching operation.

I claim:

1. In the production of semiconductor members having a crystalline semiconductor body of gallium arsenide with an alloy-bonded electrode pellet of tin, the method of reducing the junction area between different conductance regions in the body near the pellet, which comprises subjecting the semiconductor member to an etching agent consisting of aqua regia and a preponderant share of phosphoric acid reactive with the tin pellet to form a substantially insoluble coating on the pellet, said etching agent being a solvent relative to the gallium arsenide semiconductor material, so that said semiconductor body is etched away near the pellet to thereby reduce the size of the junction area.

2. In the production of semiconductor members having a crystalline semiconductor body of gallium arsenide with an alloy-bonded electrode pellet of tin, the method of reducing the junction area between different conductance regions in the body near the pellet, which comprises subjecting the semiconductor member to an etching agent consisting of aqua regia and a preponderant share of phosphoric acid reactive with the tin pellet to form a substantially insoluble coating on the pellet, said etching agent being a solvent relative to the gallium arsenide semiconductor material, maintaining during etching an elevated temperature of at least 70° C.; and continuing the process until the member has reached undercut shape at the body-pellet junction.

3. In the semiconductor production method according to claim 1, said etching agent being a mixture composed substantially of 5 to 10 parts $HNO_3$ in approximately 65% concentration, 95 to 5 parts $H_3PO_4$ in approximately 85% concentration and about 1 part HCl in approximately 25% concentration.

4. In the semiconductor production method according to claim 1, said etching agent being a mixture composed substantially of 5 to 10 parts $HNO_3$ in approximately 65% concentration, 95 to 5 parts $H_3PO_4$ in approximately 85% concentration and about 1 part HCl in approximately 25% concentration, the etching being performed at a temperature above 70° and below 100° C. until the member has reached undercut shape at the body-pellet junction.

References Cited by the Examiner

UNITED STATES PATENTS 3,081,211 3/1963 Rickel ---------------- 156—9
3,110,849 11/1963 Soltys ------------ 156—17 X ALEXANDER WYMAN, *Primary Examiner.*

JACOB STEINBERG, *Examiner.*